(12) United States Patent
Hsu (10) Patent No.: US 9,165,990 B1
(45) Date of Patent: Oct. 20, 2015

(54) ORGANIC ELECTROLUMINESCENCE DEVICE AND MANUFACTURING METHOD THEREOF

(71) Applicant: Shenzhen China Star Optoelectronics Technology Co., Ltd., Shenzhen, Guangdong (CN)

(72) Inventor: Yuanjun Hsu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 114 days.

(21) Appl. No.: 14/345,744

(22) PCT Filed: Dec. 31, 2013

(86) PCT No.: PCT/CN2013/091204
§ 371 (c)(1),
(2) Date: Mar. 19, 2014

(87) PCT Pub. No.: WO2015/058459
PCT Pub. Date: Apr. 30, 2015

(30) Foreign Application Priority Data

Oct. 22, 2013 (CN) .......................... 2013 1 0500889

(51) Int. Cl.
*H01L 29/08* (2006.01)
*H01L 35/24* (2006.01)
(Continued)

(52) U.S. Cl.
CPC ........ *H01L 27/3258* (2013.01); *H01L 23/5226* (2013.01); *H01L 27/3248* (2013.01); *H01L 27/3262* (2013.01); *H01L 29/04* (2013.01); *H01L 29/16* (2013.01); *H01L 29/167* (2013.01); *H01L 29/458* (2013.01);
(Continued)

(58) Field of Classification Search
USPC ........... 257/759, E21.503, E25.008–E25.009, 257/40, 98, 642–643, E39.007, 257/E51.001–E51.052, E27.117–E27.119, 257/482, 99
See application file for complete search history.

(56) References Cited

U.S. PATENT DOCUMENTS

| | | | | | |
|---|---|---|---|---|---|
| 2004/0241922 | A1* | 12/2004 | Toida | ................. | B23K 26/0613 438/166 |
| 2006/0088961 | A1* | 4/2006 | Jung | ................... | H01L 29/4908 438/149 |
| 2009/0032096 | A1* | 2/2009 | Tanaka | ................ | H01L 27/1285 136/256 |

FOREIGN PATENT DOCUMENTS

| CN | 101964309 A | 2/2011 |
|---|---|---|
| CN | 102931207 A | 2/2013 |

*Primary Examiner* — Dao H Nguyen
*Assistant Examiner* — Tram H Nguyen
(74) *Attorney, Agent, or Firm* — Andrew C. Cheng (57) ABSTRACT

The present invention provides an organic electroluminescence device and a manufacturing method thereof. The organic electroluminescence device includes: an organic backing layer (22), which provides a flexible base and isolates external moisture; a light absorption layer (24), which is arranged on the organic backing layer (22); an active thin-film transistor pixel array, which is arranged on the light absorption layer (24), the active thin-film transistor pixel array comprising at least a crystalline semiconductor layer that is formed by means of laser annealing; and an organic electroluminescence layer (29), which is arranged on the active thin-film transistor pixel array. The light absorption layer (24) absorbs the laser that transmits through the active thin-film transistor pixel array and irradiates the light absorption layer (24) during the laser annealing in order to prevent the organic backing layer (22) from being affected by the laser and getting deteriorated.

18 Claims, 4 Drawing Sheets

(51) Int. Cl.
*H01L 51/00* (2006.01)
*H01L 27/32* (2006.01)
*H01L 51/52* (2006.01)
*H01L 29/786* (2006.01)
*H01L 51/50* (2006.01)
*H01L 29/16* (2006.01)
*H01L 29/51* (2006.01)
*H01L 23/522* (2006.01)
*H01L 51/56* (2006.01)
*H01L 29/167* (2006.01)
*H01L 29/45* (2006.01)
*H01L 29/49* (2006.01)
*H01L 29/66* (2006.01)
*H01L 29/04* (2006.01)

(52) U.S. Cl.
CPC ......... *H01L 29/495* (2013.01); *H01L 29/4908* (2013.01); *H01L 29/51* (2013.01); *H01L 29/518* (2013.01); *H01L 29/66757* (2013.01); *H01L 29/78603* (2013.01); *H01L 29/78675* (2013.01); *H01L 51/0015* (2013.01); *H01L 51/0027* (2013.01); *H01L 51/0097* (2013.01); *H01L 51/5012* (2013.01); *H01L 51/5253* (2013.01); *H01L 51/5259* (2013.01); *H01L 51/5284* (2013.01); *H01L 51/56* (2013.01); *H01L 51/0034* (2013.01); *H01L 2227/323* (2013.01); *H01L 2251/301* (2013.01); *H01L 2251/308* (2013.01); *H01L 2251/5338* (2013.01)

ORGANIC ELECTROLUMINESCENCE DEVICE AND MANUFACTURING METHOD THEREOF

BACKGROUND OF THE INVENTION

1. Field of the Invention

The present invention relates to the field of flat panel displaying, and in particular to an organic electroluminescence device and a manufacturing method thereof.

2. The Related Arts

A flat display device has various advantages, such as thin device body, low power consumption, and being free of radiation, and is thus of wide applications. The flat display devices that are currently available include liquid crystal displays (LCDs) and organic electroluminescence devices (OELDs), which are also referred to as organic light emitting diodes (OLEDs).

The known liquid crystal displays are generally backlighting liquid crystal displays, which include an enclosure, a liquid crystal display panel arranged in the enclosure, and a backlight module mounted inside the enclosure. The principle of operation of the liquid crystal display panel is that liquid crystal molecules are interposed between two parallel glass substrates and a driving voltage is applied to the glass substrates to control the rotation of the liquid crystal molecules so as to refract out the light from the backlight module to form an image.

Figure 1:
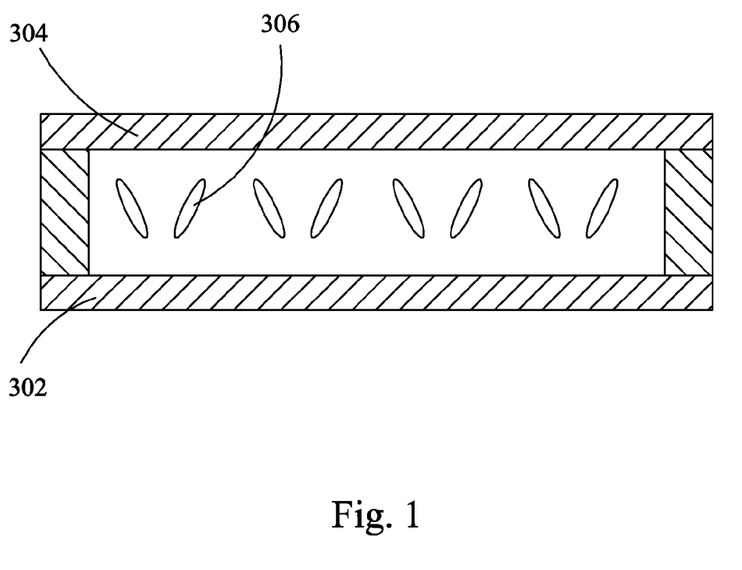
FIG. 1 is a schematic view showing the structure of a conventional liquid crystal display panel.

Referring to FIG. 1, the conventional liquid crystal display panel generally comprises: a thin-film transistor (TFT) substrate 302, a color filter (CF) substrate 304 that is laminated on the thin-film transistor substrate 302, and a liquid crystal layer 306 arranged between the thin-film transistor substrate 302 and the color filter substrate 304. The thin-film transistor substrate 302 drives the liquid crystal molecules contained in the liquid crystal layer 306 to rotate in order to display a corresponding image.

The organic electroluminescence devices, which show the characteristics of self-illumination, high brightness, wide view angle, high contrast, flexibility, and low energy consumption, attract wide attention for serving as the next-generation display measures and gradually substitute the conventional liquid crystal displays for wide applications in various fields including mobile phone screens, computer monitors, and full-color television. The organic electroluminescence devices are different from the conventional liquid crystal displays in that they need no backlight and they use extremely thin coating layers of organic materials directly formed on the glass substrates so that when electrical currents flow therethrough, the organic material coating layers emit light.

Figure 2:
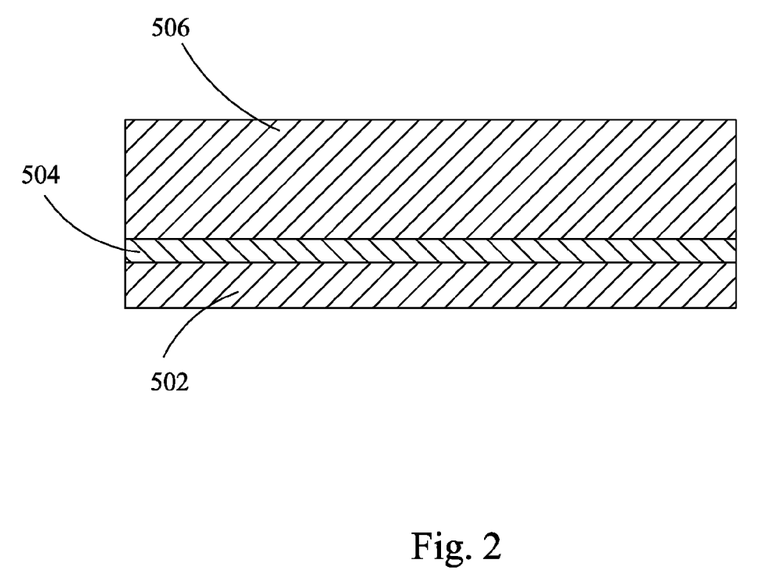
FIG. 2 is a schematic view showing the structure of a conventional active-matrix organic light emitting diode.

The currently available organic electroluminescence devices are classified according to the driving methods used and include passive-matrix organic light emitting diodes (PMOLEDs) and active-matrix organic light emitting diodes (AMOLEDs). Referring to FIG. 2, the AMOLED generally comprises a substrate 502, a thin-film transistor 504 formed on the substrate 502, and an organic light-emitting diode 506 formed on the thin-film transistor 504. The thin-film transistor 504 drives the organic light-emitting diode 506 to give off light in order to display a corresponding image.

The conventional ways of activation are generally high temperature activation and laser activation. When the high temperature activation is employed, due to the presence of a PI (Polyimide) layer, the activation temperature is not allowed to exceed 400° C. However, if the temperature is lower than 400° C., insufficiency of activation may result, leading to deterioration of the OLED thin-film transistor substrate. When laser activation is employed, irradiation of the laser to the PI layer causes property change of the PI layer due to absorption of the laser, leading to lowering of the yield rate of the OLED thin-film transistor substrate and increasing of the manufacturing cost.

SUMMARY OF THE INVENTION

An object of the present invention is to provide an organic electroluminescence device, which comprises a light absorption layer to prevent property change of a PI (Polyimide) layer during laser activation of a polysilicon layer and provide high yield rate so as to effectively reduce the manufacturing cost.

Another object of the present invention is to provide a manufacturing method of an organic electroluminescence device, which arranges a light absorption layer between an organic substrate layer and a buffer layer to prevent the organic substrate layer from changing property due to absorption of laser in a laser activation process of a polysilicon layer so as to improve the yield rate of the organic electroluminescence device and reduce the manufacturing cost.

To achieve the above objects, the present invention provides an organic electroluminescence device, which comprises: an organic backing layer, which provides a flexible base and isolates external moisture;

a light absorption layer, which is arranged on the organic backing layer;

an active thin-film transistor pixel array, which is arranged on the light absorption layer, the active thin-film transistor pixel array comprising at least a crystalline semiconductor layer that is formed by means of laser annealing; and an organic electroluminescence layer, which is arranged on the active thin-film transistor pixel array, wherein the light absorption layer absorbs the laser that transmits through the active thin-film transistor pixel array and irradiates the light absorption layer during the laser annealing in order to prevent the organic backing layer from being affected by the laser and getting deteriorated.

The organic electroluminescence device is formed on a substrate.

The organic backing layer comprises polyimide.

The crystalline semiconductor layer comprises one of polysilicon and continuous grain silicon or a combination thereof.

The laser annealing uses excimer ultraviolet laser and the light absorption layer comprises an ultraviolet spectrum absorption material to absorb the excimer ultraviolet laser irradiating the light absorption layer.

The light absorption layer comprises a single-layer structure, which comprises one of amorphous silicon, silicon-rich silicon oxide, and silicon-rich silicon nitride or a combination thereof.

The light absorption layer comprises a multi-layer structure, in which at least one layer comprises one of amorphous silicon, silicon-rich silicon oxide, and silicon-rich silicon nitride or a combination thereof.

The organic electroluminescence device further comprises a buffer layer, the buffer layer being arranged between the light absorption layer and the active thin-film transistor pixel array to prevent impurities from spreading to the active thin-film transistor pixel array.

The active thin-film transistor pixel array comprises:

the crystalline semiconductor layer, which comprises a source zone, a drain zone, and a channel zone;

a gate insulation layer arranged on the semiconductor layer;

a gate terminal arranged on the gate insulation layer;

a protective layer arranged on the gate terminal;

a drain/source terminal arranged on the protective layer, the source terminal being electrically connected by a via hole to the source zone, the drain terminal being electrically connected by a via hole to the drain zone; and a passivation layer arranged on the source/drain terminal.

The protective layer comprises one of silicon oxide and silicon nitride or a combination thereof.

The organic electroluminescence layer is arranged on the passivation layer.

The organic electroluminescence device further comprises a support, the support being arranged on the organic electroluminescence layer.

The present invention also provides a manufacturing method of an organic electroluminescence device, which comprises the following steps:

(1) providing a substrate;

(2) forming an organic backing layer on the substrate;

(3) forming a light absorption layer on the organic backing layer, the light absorption layer functioning to absorb laser irradiating on a surface thereof;

(4) forming a buffer layer on the light absorption layer;

(5) form an amorphous silicon layer on the buffer layer, applying laser annealing to convert the amorphous silicon layer into a polysilicon layer, and patternizing the polysilicon layer;

(6) subjecting the polysilicon layer to a doping operation;

(7) laser-activating impurities contained in the polysilicon layer; and (8) sequentially forming a gate insulation layer, a gate terminal, a protective layer, a source/drain terminal, a passivation layer, a pixel electrode, and an organic layer on the polysilicon layer.

The light absorption layer has an absorption wavelength range that comprises 308 nm.

The light absorption layer comprises a single-layer structure or a multi-layer structure, which comprises one of amorphous silicon, silicon-rich silicon oxide, and silicon-rich silicon nitride or a combination thereof.

The buffer layer comprises a silicon nitride layer formed on the light absorption layer and a silicon oxide layer formed on the silicon nitride layer; the gate terminal has a material comprising at least one of aluminum and molybdenum; the source/drain terminal has a material comprises aluminum; the pixel electrode has a material comprising at least one of indium tin oxide and silver; and the protective layer comprises a silicon oxide layer formed on the gate terminal and a silicon nitride layer formed on the silicon oxide layer.

The present invention further comprises a manufacturing method of an organic electroluminescence device, which comprises the following steps:

(1) providing a substrate;

(2) forming an organic backing layer on the substrate;

(3) forming a light absorption layer on the organic backing layer, the light absorption layer functioning to absorb laser irradiating on a surface thereof;

(4) forming a buffer layer on the light absorption layer;

(5) form an amorphous silicon layer on the buffer layer, applying laser annealing to convert the amorphous silicon layer into a polysilicon layer, and patternizing the polysilicon layer;

(6) subjecting the polysilicon layer to a doping operation;

(7) laser-activating impurities contained in the polysilicon layer; and (8) sequentially forming a gate insulation layer, a gate terminal, a protective layer, a source/drain terminal, a passivation layer, a pixel electrode, and an organic layer on the polysilicon layer;

wherein the light absorption layer has an absorption wavelength range that comprises 308 nm; and wherein the light absorption layer comprises a single-layer structure or a multi-layer structure, which comprises one of amorphous silicon, silicon-rich silicon oxide, and silicon-rich silicon nitride or a combination thereof.

The buffer layer comprises a silicon nitride layer formed on the light absorption layer and a silicon oxide layer formed on the silicon nitride layer; the gate terminal has a material comprising at least one of aluminum and molybdenum; the source/drain terminal has a material comprises aluminum; the pixel electrode has a material comprising at least one of indium tin oxide and silver; and the protective layer comprises a silicon oxide layer formed on the gate terminal and a silicon nitride layer formed on the silicon oxide layer.

The efficacy of the present invention is that the present invention provides an organic electroluminescence device and a manufacturing method thereof, wherein a light absorption layer is arranged between an organic backing layer and a buffer layer in order to effectively prevent the organic backing layer from changing property resulting from absorption of laser during a laser activation process of a polysilicon layer and increase the yield rate of the organic electroluminescence device. Further, the manufacturing process is simple and the cost is low so as to be advantageous for cost control.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 3:
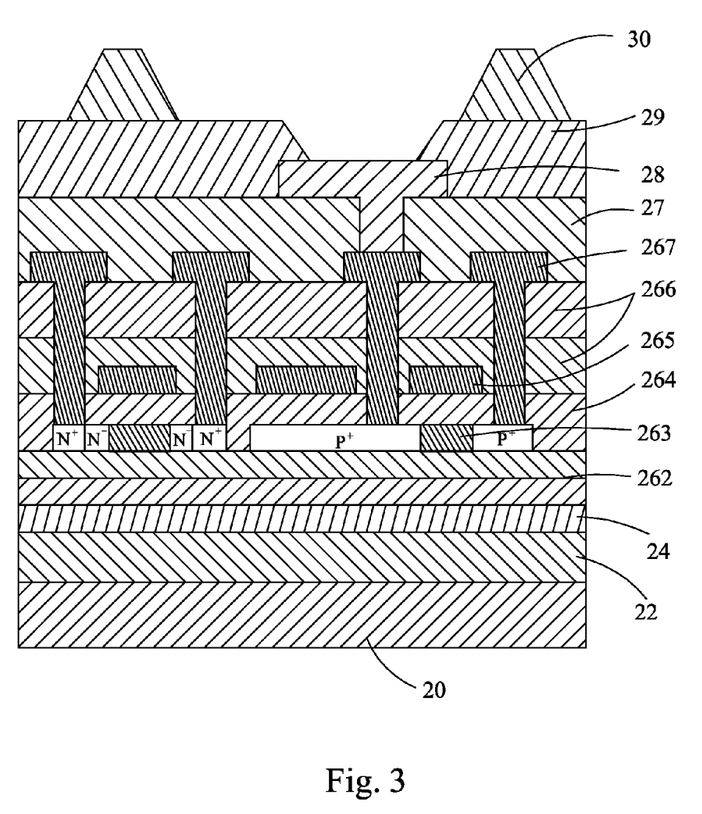
FIG. 3 is a schematic view showing the structure of a substrate of an organic electroluminescence device according to the present invention.

Referring to FIG. 3, the present invention provides an organic electroluminescence device. The organic electroluminescence device is formed on a substrate 20 and comprises: an organic backing layer 22, which provides a flexible base and isolates external moisture; a light absorption layer 24, which is arranged on the organic backing layer 22; an active thin-film transistor pixel array, which is arranged on the light absorption layer 24, the active thin-film transistor pixel array comprising at least a crystalline semiconductor layer that is formed by means of laser annealing; and an organic electroluminescence layer 29, which is arranged on the active thin-film transistor pixel array. The light absorption layer 24 absorbs the laser that transmits through the active thin-film transistor pixel array and irradiates the light absorption layer 24 during the laser annealing in order to prevent the organic backing layer 22 from being affected by the laser and getting deteriorated thereby improving the yield rate of the organic electroluminescence device.

Specifically, the organic backing layer 22 comprises polyimide. The crystalline semiconductor layer comprises one of polysilicon and continuous grain silicon or a combination thereof. The laser annealing operation uses excimer ultraviolet laser. The light absorption layer 24 comprises an ultraviolet spectrum absorption material, which absorbs the excimer ultraviolet laser that irradiates the light absorption layer 24.

The light absorption layer 24 can be of a single-layer structure or a multi-layer structure. When the light absorption layer 24 is a single-layer structure, it comprises one of amorphous silicon, silicon-rich silicon oxide, and silicon-rich silicon nitride, or a combination thereof. When the light absorption layer 24 is a multi-layer structure, at least one of the layers comprises one of amorphous silicon, silicon-rich silicon oxide, and silicon-rich silicon nitride or a combination thereof. Whether being a single-layer structure or a multi-layer structure, the light absorption layer 24 can effectively absorb laser of a wavelength of 308 nm and effectively prevent the organic backing layer 22 from being affected by the laser and getting deteriorated.

Further, the organic electroluminescence device further comprises a buffer layer 262, which is formed between the light absorption layer 24 and the active thin-film transistor pixel array by chemical vapor deposition (CVD) in order to prevent impurities from spreading to the active thin-film transistor pixel array.

The active thin-film transistor pixel array comprises: the crystalline semiconductor layer that comprises a source zone, a drain zone, and a channel zone; a gate insulation layer 264 arranged on the semiconductor layer 263; a gate terminal 265 arranged on the gate insulation layer 264; a protective layer 266 arranged on the gate terminal 265; and a drain/source terminal 267 arranged on the protective layer 266, wherein the source terminal is electrically connected by a via hole to the source zone and the drain terminal is electrically connected by a via hole to the drain zone; and a passivation layer 27 arranged on the source/drain terminal 267.

Further, the gate terminal 265 has a material that comprises at least one of aluminum (Al) and molybdenum (Mo). The source/drain terminal 267 has a material comprising at least one of aluminum and molybdenum. The protective layer 266 comprises one of silicon oxide and silicon nitride or a combination thereof. The organic electroluminescence layer 29 is formed on the passivation layer 27. The organic electroluminescence device further comprises a support (PS) 30. The support 30 is arranged on the organic electroluminescence layer 29.

Figure 4:
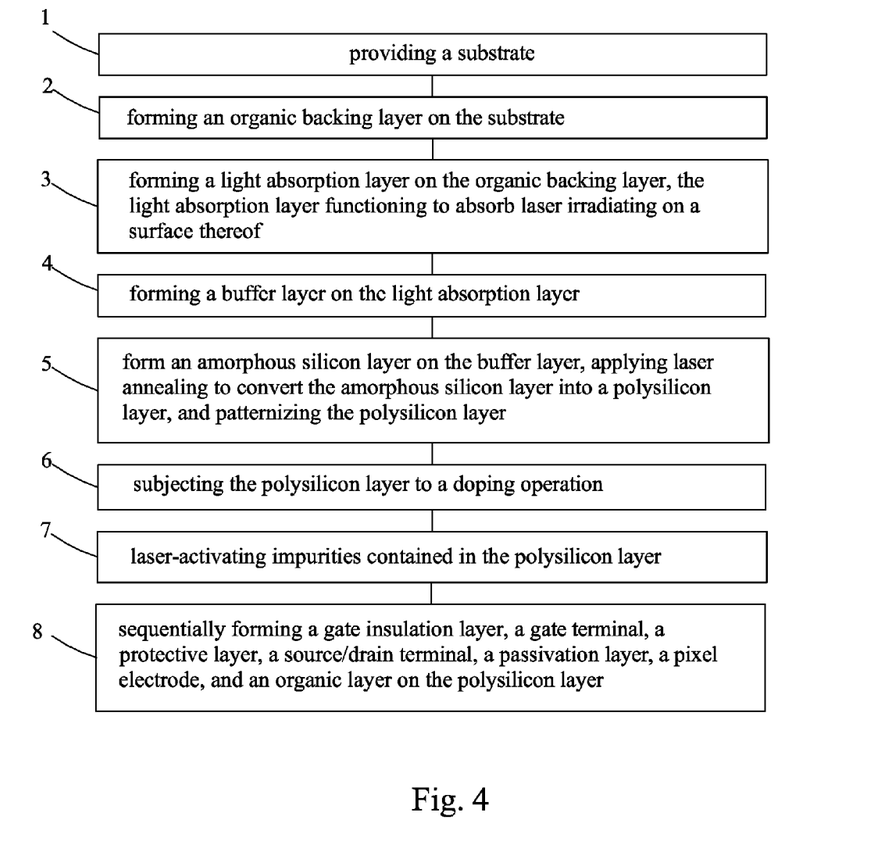
FIG. 4 is a flow chart illustrating a manufacturing method of an organic electroluminescence device according to the present invention.

Referring to FIG. 4, with additional reference to FIG. 3, the present invention also provides a manufacturing method of an organic electroluminescence device, which comprises the following steps:

Step 1: providing a substrate 20.

In the instant embodiment, the substrate 20 is a transparent substrate, preferably a glass substrate.

Step 2: forming an organic backing layer 22 on the substrate 20.

The organic backing layer 22 comprises polyimide and is formed on the substrate 20 by coating for providing a flexible base and isolating external moisture.

Step 3: forming a light absorption layer 24 on the organic backing layer 22, the light absorption layer 24 functioning to absorb laser irradiating on a surface thereof.

The light absorption layer 24 comprises an ultraviolet spectrum absorption material to absorb laser that transmits through the active thin-film transistor pixel array and irradiates the light absorption layer 24 during laser annealing in order to prevent the organic backing layer 22 from being affected by the laser and getting deteriorated thereby improving the yield rate of the organic electroluminescence device.

Specifically, the light absorption layer 24 can be of a single-layer structure or a multi-layer structure. When the light absorption layer 24 is a single-layer structure, it comprises one of amorphous silicon, silicon-rich silicon oxide, and silicon-rich silicon nitride, or a combination thereof. When the light absorption layer 24 is a multi-layer structure, at least one of the layers comprises one of amorphous silicon, silicon-rich silicon oxide, and silicon-rich silicon nitride or a combination thereof. Whether being a single-layer structure or a multi-layer structure, the light absorption layer 24 can effectively absorb laser of a wavelength of 308 nm and effectively prevent the organic backing layer 22 from being affected by the laser and getting deteriorated.

Step 4: forming a buffer layer 262 on the light absorption layer 24.

The buffer layer 262 is formed between the light absorption layer 24 and the active thin-film transistor pixel array by chemical vapor deposition for preventing impurities from spreading to the active thin-film transistor pixel array.

Step 5: form an amorphous silicon layer on the buffer layer 262, applying laser annealing to convert the amorphous silicon layer into a polysilicon layer 263, and patternizing the polysilicon layer 263.

The crystalline semiconductor layer comprises one of polysilicon and continuous grain silicon or a combination thereof. The laser annealing operation uses excimer ultraviolet laser. The light absorption layer 24 absorbs the excimer ultraviolet laser irradiating the light absorption layer 24.

Step 6: subjecting the polysilicon layer 263 to a doping operation.

The doping operation can be achieved by selecting one of the known techniques, which can fulfill the technical result of the present invention.

Step 7: laser-activating impurities contained in the polysilicon layer 263.

Here, a laser having a wavelength of 308 nm (such as Xenon-Chloride laser) is used. When the laser is used to activate the impurities contained in the polysilicon layer 263, the light absorption layer 24 absorbs the laser energy irradiating a surface thereof so as to effectively protect the organic backing layer 22 and prevent the organic backing layer 22 from being affected by the laser and getting deteriorated.

Step 8: sequentially forming a gate insulation layer 264, a gate terminal 265, a protective layer 266, a source/drain terminal 267, a passivation layer 27, a pixel electrode 28, and an organic layer 29 on the polysilicon layer 263.

The source terminal is electrically connected by a via hole to the source zone and the drain terminal is electrically connected by a via hole to the drain zone. The passivation layer 27 is arranged on the source/drain terminal 267.

Further, the gate terminal 265 has a material that comprises at least one of aluminum (Al) and molybdenum (Mo). The source/drain terminal 267 has a material comprising at least one of aluminum and molybdenum. The protective layer 266 comprises one of silicon oxide and silicon nitride or a combination thereof. The organic electroluminescence layer 29 is formed on the passivation layer 27.

In summary, the present invention provides an organic electroluminescence device and a manufacturing method thereof, wherein a light absorption layer is arranged between an organic backing layer and a buffer layer in order to effectively prevent the organic backing layer from changing property resulting from absorption of laser during a laser activation process of a polysilicon layer and increase the yield rate of the organic electroluminescence device. Further, the manufacturing process is simple and the cost is low so as to be advantageous for cost control.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An organic electroluminescence device, comprising:
   an organic backing layer, which provides a flexible base and isolates external moisture;
   a light absorption layer, which is arranged on the organic backing layer;
   an active thin-film transistor pixel array, which is arranged on the light absorption layer, the active thin-film transistor pixel array comprising at least a crystalline semiconductor layer that is formed by means of laser annealing; and
   an organic electroluminescence layer, which is arranged on the active thin-film transistor pixel array;
   wherein the light absorption layer absorbs the laser that transmits through the active thin-film transistor pixel array and irradiates the light absorption layer during the laser annealing in order to prevent the organic backing layer from being affected by the laser and getting deteriorated.

2. The organic electroluminescence device as claimed in claim 1, wherein the organic electroluminescence device is formed on a substrate.

3. The organic electroluminescence device as claimed in claim 1, wherein the organic backing layer comprises polyimide.

4. The organic electroluminescence device as claimed in claim 1, wherein the crystalline semiconductor layer comprises one of polysilicon and continuous grain silicon or a combination thereof.

5. The organic electroluminescence device as claimed in claim 1, wherein the laser annealing uses excimer ultraviolet laser and the light absorption layer comprises an ultraviolet spectrum absorption material to absorb the excimer ultraviolet laser irradiating the light absorption layer.

6. The organic electroluminescence device as claimed in claim 1, wherein the light absorption layer comprises a single-layer structure, which comprises one of amorphous silicon, silicon-rich silicon oxide, and silicon-rich silicon nitride or a combination thereof.

7. The organic electroluminescence device as claimed in claim 1, wherein the light absorption layer comprises a multi-layer structure, in which at least one layer comprises one of amorphous silicon, silicon-rich silicon oxide, and silicon-rich silicon nitride or a combination thereof.

8. The organic electroluminescence device as claimed in claim 1, wherein the organic electroluminescence device further comprises a buffer layer, the buffer layer being arranged between the light absorption layer and the active thin-film transistor pixel array to prevent impurities from spreading to the active thin-film transistor pixel array.

9. The organic electroluminescence device as claimed in claim 1, wherein the active thin-film transistor pixel array comprises:
   the crystalline semiconductor layer, which comprises a source zone, a drain zone, and a channel zone;
   a gate insulation layer arranged on the semiconductor layer;
   a gate terminal arranged on the gate insulation layer;
   a protective layer arranged on the gate terminal;
   a drain/source terminal arranged on the protective layer, the source terminal being electrically connected by a via hole to the source zone, the drain terminal being electrically connected by a via hole to the drain zone; and
   a passivation layer arranged on the source/drain terminal.

10. The organic electroluminescence device as claimed in claim 9, wherein the protective layer comprises one of silicon oxide and silicon nitride or a combination thereof.

11. The organic electroluminescence device as claimed in claim 9, wherein the organic electroluminescence layer is arranged on the passivation layer.

12. The organic electroluminescence device as claimed in claim 11, wherein the organic electroluminescence device further comprises a support, the support being arranged on the organic electroluminescence layer.

13. A manufacturing method of an organic electroluminescence device, comprising the following steps:
   (1) providing a substrate;
   (2) forming an organic backing layer on the substrate;
   (3) forming a light absorption layer on the organic backing layer, the light absorption layer functioning to absorb laser irradiating on a surface thereof;
   (4) forming a buffer layer on the light absorption layer;
   (5) form an amorphous silicon layer on the buffer layer, applying laser annealing to convert the amorphous silicon layer into a polysilicon layer, and patternizing the polysilicon layer;
   (6) subjecting the polysilicon layer to a doping operation;
   (7) laser-activating impurities contained in the polysilicon layer; and
   (8) sequentially forming a gate insulation layer, a gate terminal, a protective layer, a source/drain terminal, a passivation layer, a pixel electrode, and an organic layer on the polysilicon layer.

14. The manufacturing method of an organic electroluminescence device as claimed in claim 13, wherein the light absorption layer has an absorption wavelength range that comprises 308 nm.

15. The manufacturing method of an organic electroluminescence device as claimed in claim 13, wherein the light absorption layer comprises a single-layer structure or a multi-layer structure, which comprises one of amorphous silicon, silicon-rich silicon oxide, and silicon-rich silicon nitride or a combination thereof.

16. The manufacturing method of an organic electroluminescence device as claimed in claim 13, wherein the buffer layer comprises a silicon nitride layer formed on the light absorption layer and a silicon oxide layer formed on the silicon nitride layer; the gate terminal has a material comprising at least one of aluminum and molybdenum; the source/drain terminal has a material comprises aluminum; the pixel electrode has a material comprising at least one of indium tin oxide and silver; and the protective layer comprises a silicon oxide layer formed on the gate terminal and a silicon nitride layer formed on the silicon oxide layer.

17. A manufacturing method of an organic electroluminescence device, comprising the following steps:
(1) providing a substrate;
(2) forming an organic backing layer on the substrate;
(3) forming a light absorption layer on the organic backing layer, the light absorption layer functioning to absorb laser irradiating on a surface thereof;
(4) forming a buffer layer on the light absorption layer;
(5) form an amorphous silicon layer on the buffer layer, applying laser annealing to convert the amorphous silicon layer into a polysilicon layer, and patternizing the polysilicon layer;
(6) subjecting the polysilicon layer to a doping operation;
(7) laser-activating impurities contained in the polysilicon layer; and
(8) sequentially forming a gate insulation layer, a gate terminal, a protective layer, a source/drain terminal, a passivation layer, a pixel electrode, and an organic layer on the polysilicon layer;
wherein the light absorption layer has an absorption wavelength range that comprises 308 nm; and
wherein the light absorption layer comprises a single-layer structure or a multi-layer structure, which comprises one of amorphous silicon, silicon-rich silicon oxide, and silicon-rich silicon nitride or a combination thereof.

18. The manufacturing method of an organic electroluminescence device as claimed in claim 17, wherein the buffer layer comprises a silicon nitride layer formed on the light absorption layer and a silicon oxide layer formed on the silicon nitride layer; the gate terminal has a material comprising at least one of aluminum and molybdenum; the source/drain terminal has a material comprises aluminum; the pixel electrode has a material comprising at least one of indium tin oxide and silver; and the protective layer comprises a silicon oxide layer formed on the gate terminal and a silicon nitride layer formed on the silicon oxide layer.

* * * * *